(12) United States Patent
Nakamoto et al.

(10) Patent No.: US 8,378,755 B2
(45) Date of Patent: Feb. 19, 2013

(54) OSCILLATION CIRCUIT

(75) Inventors: Hiroyuki Nakamoto, Kawasaki (JP); Hiroyuki Ito, Yokohama (JP)

(73) Assignees: Fujitsu Limited, Kawasaki (JP); Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/216,856

(22) Filed: Aug. 24, 2011

(65) Prior Publication Data

US 2012/0126907 A1 May 24, 2012

(30) Foreign Application Priority Data

Nov. 24, 2010 (JP) ................................. 2010-261418

(51) Int. Cl.
*H03B 5/32* (2006.01)

(52) U.S. Cl. ........................ 331/116 R; 331/158; 331/44

(58) Field of Classification Search .............. 331/116 R, 331/116 FE, 158, 44, 175, 177 R, 177 V
See application file for complete search history.

(56) References Cited

U.S. PATENT DOCUMENTS

| | | | | |
|---|---|---|---|---|
| 7,639,097 | B2* | 12/2009 | Tran | 331/158 |
| 7,911,285 | B2* | 3/2011 | Terada et al. | 331/158 |
| 8,217,726 | B2* | 7/2012 | Sako et al. | 331/59 |
| 2006/0114074 | A1 | 6/2006 | Matsui et al. | |

FOREIGN PATENT DOCUMENTS

| | | |
|---|---|---|
| JP | 07-131247 A | 5/1995 |
| JP | 11-330856 A | 11/1999 |
| JP | 2006-157767 A | 6/2006 |

* cited by examiner

*Primary Examiner* — Ryan Johnson
(74) *Attorney, Agent, or Firm* — Arent Fox LLP

(57) ABSTRACT

An oscillation circuit has a first inverter connected to an external piezoelectric resonator, a first feedback resistor disposed between input/output terminals of the first inverter, first/second variable capacitive elements connected to input/output of the first inverter, a charging circuit supplying input/output terminal with a reference current to charge the capacitive element, a comparator comparing a charging voltage of input/output with a reference voltage, and a control circuit that, in a calibration operation, at a first time, causes the charging circuit to start supply the reference current to the input terminal or the output terminal, and, at a second time after the first time, generates the control signal for setting a capacitance value of the first or second variable capacitive element so that the charging voltage becomes close to the reference voltage according to a comparison result of the comparator.

20 Claims, 15 Drawing Sheets

OSCILLATION CIRCUIT

CROSS-REFERENCE TO RELATED APPLICATIONS

This application is based upon and claims the benefit of priority of the prior Japanese Patent Application No. 2010-261418, filed on Nov. 24, 2010, the entire contents of which are incorporated herein by reference.

FIELD

The present invention relates to an oscillation circuit.

BACKGROUND

An oscillation circuit (a crystal oscillator) using a piezoelectric resonator such as a crystal resonator obtain an oscillation frequency with a relatively high degree of accuracy and so has been widely used. For example, in a radio communication system, a phase locked loop (PLL) that generates a local oscillation signal necessary for modulating a received signal and demodulating a transmission signal is mounted inside an integrated circuit (IC). The PLL circuit includes a voltage controlled oscillator (VCO). The PLL circuit generates an appropriate local oscillation signal by changing a control voltage or a phase so that an output frequency multiplied by a reference clock is obtained. However, since an IC has a manufacture variation, in each sample, the reference clock and the output frequencies of the PLL circuit slightly different from each other.

Such a variation is adjusted in a digital baseband unit through an auto frequency control (AFC) circuit that matches a frequency of a reference clock of a terminal with a frequency of a reference signal from a base station during communication. The AFC circuit has a controllable range, and an allowable frequency variation of the reference clock is limited to the controllable range. Thus, the reference clock generally requires a high degree of accuracy of the order of tens of parts per million (ppm) with respect to the voltage, the temperature, and a manufacture variation. For this reason, there has been used a voltage controlled temperature compensated crystal oscillator (VCTCXO), which is an oscillator having a small frequency variation, an expensive external component.

In recent years, in a radio communication system, the miniaturization, lightening, and cost reduction has been strongly demanded. Particularly, since the demand for cost reduction is high, an oscillation circuit employing a piezoelectric resonator (a crystal resonator) such as a quartz crystal is attracting attention as an inexpensive oscillation circuit that substitutes for the VCTCXO.

The oscillation circuit has a simple configuration in which an inexpensive piezoelectric element such as a quartz crystal, an IC internal oscillator such as a complementary metal oxide semiconductor (CMOS) inverter, and variable IC internal load capacitors connected to an input and an output of the CMOS inverter are mounted. However, a variation of the piezoelectric resonator such as a quartz crystal is large, and a degree of frequency accuracy is not as high as the VCTCXO. The frequency of the oscillation circuit is decided depending on the piezoelectric resonator such as a quartz crystal and a load capacitance value inside the IC. Thus, the frequency variation is reduced by minutely adjusting the variable capacitance value inside the IC.

An oscillation circuit is disclosed in, for example, Japanese Patent Application Laid-Open Nos. 7-131247, 11-330856, and 2006-157767.

However, the crystal oscillation circuit has a problem in that since there are not only a variation of the piezoelectric resonator such as a quartz crystal influenced by the temperature, but also an internal load capacitance variation in the IC, the frequency of the reference clock that is not adjusted yet is greatly different from a desired value and deviates from the controllable range of AFC control inside the communication system. The load capacitance variation is reduced by mounting a high-accuracy IC external component. However, in this case, the number of components increases, and miniaturization and cost reduction are difficult to achieve. Further, in order to directly detect that an oscillation frequency has been deviated, a high-accuracy frequency detector of the order of ppm is necessary. However, this technique is not suitable for miniaturization and cost reduction.

As described above, the oscillation circuit employing the piezoelectric resonator such as a quartz crystal is required to simply reduce the oscillation frequency variation at a low cost.

SUMMARY

An one aspect of the embodiments is an oscillation circuit, connected to an external piezoelectric resonator, including: a first inverter circuit that includes an input terminal and an output terminal which are connected to both terminals of the piezoelectric resonator, respectively; a first feedback resistor that is disposed between the input terminal and the output terminal of the first inverter circuit; first and second variable capacitive elements that are connected to the input terminal and the output terminal of the first inverter circuit, respectively, and have capacitance values that are variably settable by a control signal; a charging circuit that supplies the input terminal or the output terminal with a certain reference current in order to charge the first or second variable capacitive element; a comparator that compares a charging voltage of the input terminal or the output terminal with a reference voltage; and a control circuit that, in a calibration operation, at a first time, causes the charging circuit to start supply the reference current to the input terminal or the output terminal, and, at a second time after the first time, generates the control signal for setting a capacitance value of the first or second variable capacitive element so that the charging voltage becomes close to the reference voltage according to a comparison result of the comparator.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
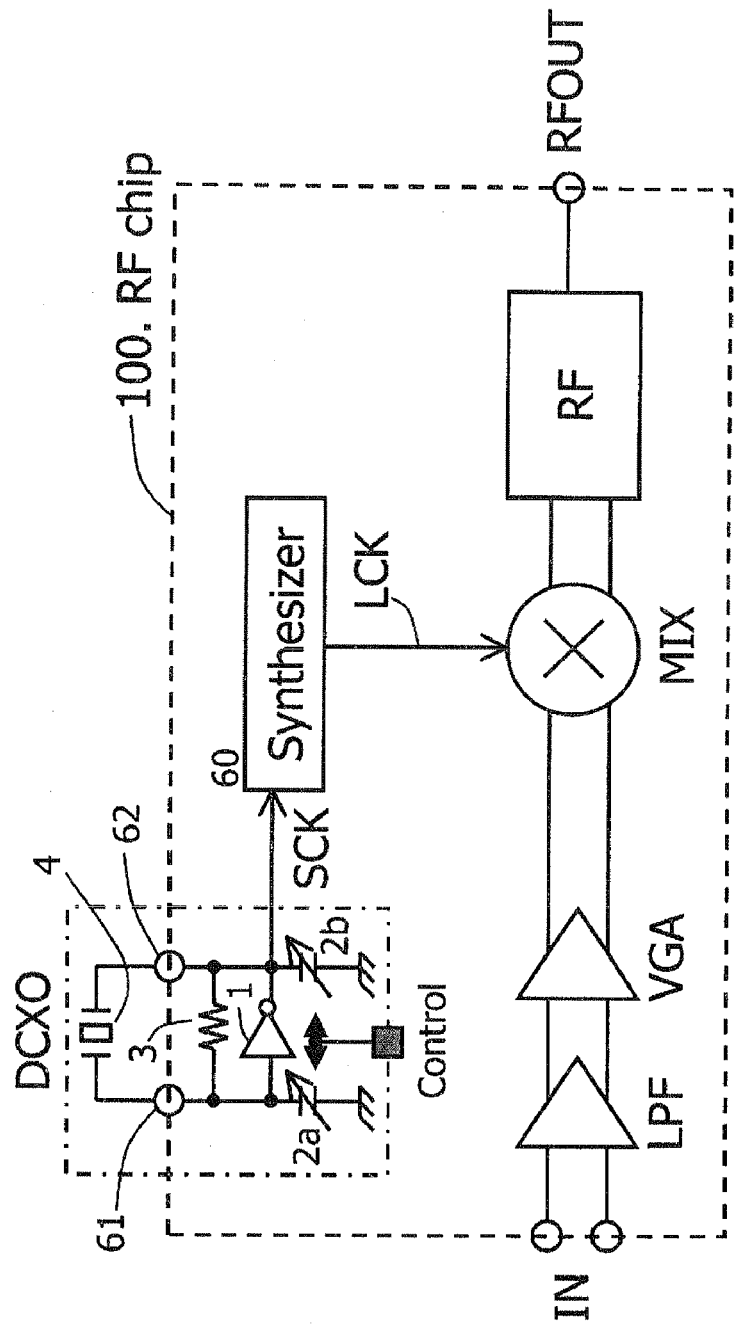
FIG. 1 is a diagram illustrating a communication device having an oscillation circuit according to the present embodiment.

FIG. 1 is a diagram illustrating a communication device having an oscillation circuit according to the present embodiment. Particularly, FIG. 1 illustrates a configuration of a transmission unit of the communication device. Meanwhile, the oscillation circuit according to the present embodiment may be used for generating a reference clock of a reception unit as well.

The transmission unit includes a low pass filter LPF that receives an analog input IN, a variable gain amplifier VGA that amplifies an output of the filter, a mixer MIX that performs up-conversion by multiplying an output of the amplifier VGA by a local clock LCK generated by a synthesizer 60, and a high frequency circuit RF that outputs a high frequency output RFOUT based on an output signal of the mixer MIX.

The transmission unit further includes a digitally controlled crystal oscillator (DCXO) as an oscillation circuit that supplies the synthesizer 60 with a reference clock SCK. As illustrated in FIG. 1, a typical Pierce-type DCXO includes a piezoelectric resonator 4 (which will be hereinafter described through a crystal resonator that is an example of the piezoelectric resonator) such as a quartz crystal, which is externally connected to input and output terminals of a CMOS inverter 1 disposed in a radio frequency RF chip 100, capacitive elements 2a and 2b which are respectively connected to the input and output terminals of the CMOS inverter 1 and have a variable/controllable capacitance, and a resistive element 3 that makes the input terminal of the CMOS inverter 1 have the same DC potential as the output terminal of the CMOS inverter 1.

The input and output terminals of the CMOS inverter 1 are set to a threshold voltage by the feedback resistor 3. If electric potential of the input terminal changes due to a certain noise, the oscillation circuit DCXO starts an oscillation by an operation of the CMOS inverter 1 of inverting the input and the output. As will be described later, an oscillation frequency is decided depending on an inductance and a capacitance value of the crystal resonator 4 and capacitance values of the input and output terminals of the inverter 1.

Thus, by controlling the capacitive elements 2a and 2b by a digital signal, it is possible to change the oscillation frequency of the oscillation circuit DCXO. This is the reason why it is called the digitally controlled crystal oscillator DCXO.

Based on the reference clock SCK generated by the oscillation circuit DCXO, the PLL synthesizer 60 generates the local clock LCK multiplied by the reference clock SCK. The mixer MIX generates a high frequency transmission signal by multiplying a transmission signal by the local clock LCK. For this reason, the reference clock SCK requires a high degree of frequency accuracy. In the present embodiment, the capacitance values of the variable capacitive elements 2a and 2b are capable of being minutely adjusted by the digital control signal, so that the reference clock SCK is generated with a high degree of accuracy even if there is a variation in the crystal resonator 4. Further, input and output parasitic capacitances of the inverter 1, parasitic capacitances of pads of terminals 61 and 62, a parasitic capacitance of up to a substrate board on which the crystal resonator 4 is arranged, and the like are applied to nodes connected to the variable capacitive elements 2a and 2b. When total capacitance values of the nodes including these parasitic capacitances are measured by a calibration circuit with a high degree of accuracy, then a capacitance value is set appropriately.

First Embodiment

Figure 2:
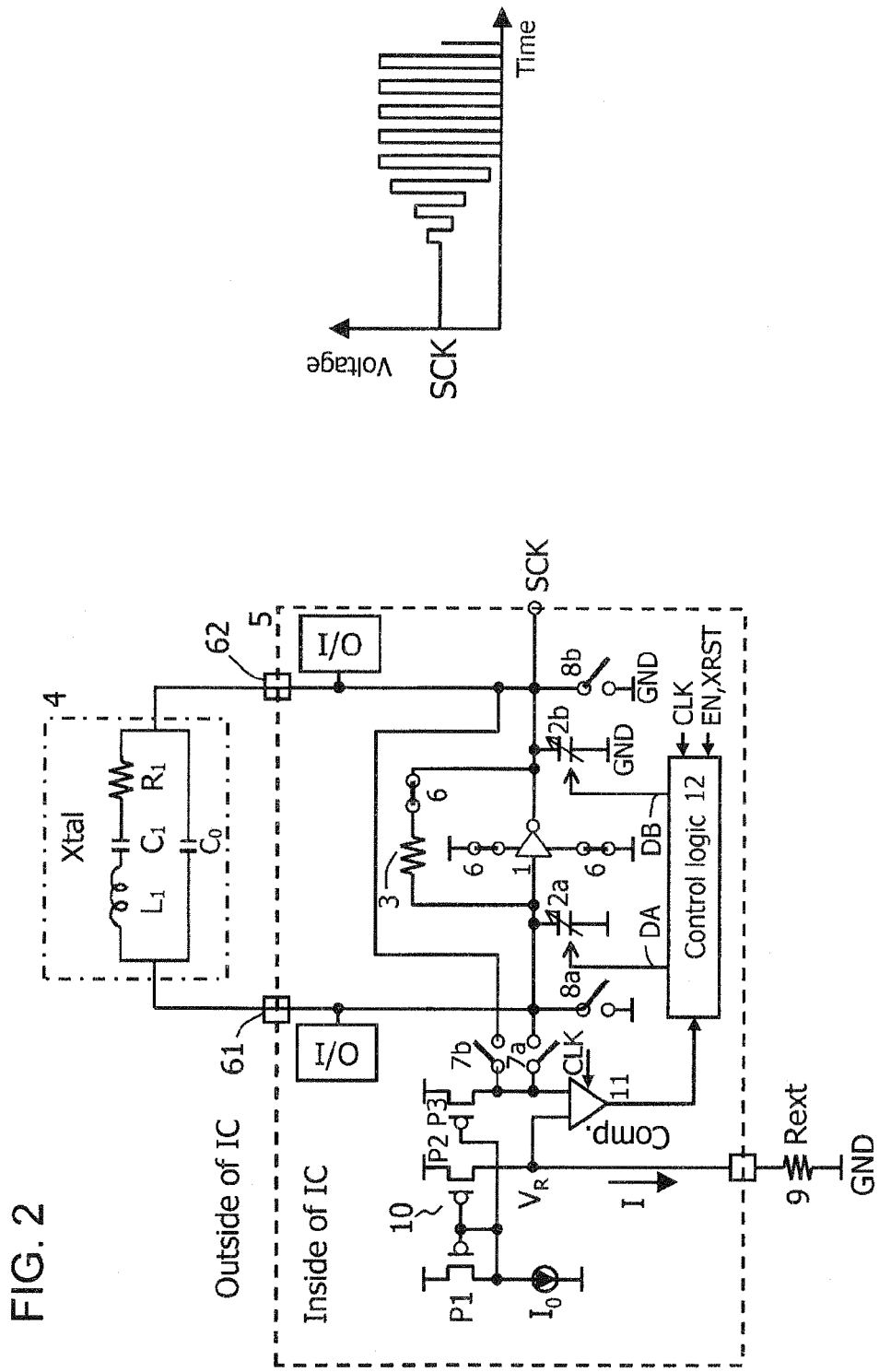
FIG. 2 is a circuit diagram of an oscillation circuit according to the first embodiment.

FIG. 2 is a circuit diagram of an oscillation circuit according to the present first embodiment. In FIG. 2, illustrated are a crystal resonator 4 that configures the oscillation circuit DCXO, and a circuit 5 which is connected to the external crystal resonator 4 and formed inside an IC chip. An equivalent circuit of the crystal resonator 4 includes a series circuit which is configured with an inductor L1, a capacitor C1, and a resistor R1 and a capacitor C0 connected in parallel to the serial circuit. The circuit 5 inside the chip includes terminals 61 and 62 connected to the crystal resonator 4, an inverter circuit 1 having an input terminal connected to the terminal 61 and an output terminal connected to the terminal 62, a feedback resistor 3 disposed between the input terminal and the output terminal of the inverter circuit 1, load capacitors 2a and 2b which are respectively connected between the input terminal and the output terminal of the inverter circuit 1 and the ground, respectively, and a control circuit 12 that sets control signals (control codes) DA and DB for controlling capacitance values of the variable capacitive elements 2a and 2b.

I/O circuits for preventing electrostatic discharge (ESD) damage are disposed near the terminals 61 and 62 of the chip. Further, between the external crystal resonator 4 and the IC 5, a line pattern for connecting the crystal resonator 4 with the IC 5 is formed on a circuit board. For this reason, a total capacitance viewed at the terminals 61 and 62 includes parasitic capacitances of pads of the terminals 61 and 62, parasitic capacitances of the I/O circuits, a parasitic capacitance of the circuit board, an input parasitic capacitance of the inverter 1, and capacitances of the variable capacitive elements 2a and 2b. The composite capacitance is added to the capacitor C0 of the crystal resonator 4, so that an oscillation frequency is determined accordingly.

The circuit 5 inside the chip includes a switch 6 that connects an oscillation loop of the oscillation circuit and turns electrical power on, switches 7a and 7b that supply the input terminal and the output terminal of the CMOS inverter 1 with a reference current, respectively, switches 8a and 8b that fix the input terminal and the output terminal of the CMOS inverter 1 to a ground GND potential, respectively, a reference current generation circuit 10 that includes a current source $I_0$ and P-type transistors P1, P2, and P3 and generates a reference current I, an external resistive element 9 that generates a reference potential $V_R$, and a comparator 11 that compares the reference potential $V_R$ with the potential of the input terminal or the output terminal of the CMOS inverter 1.

The control circuit 12 generates the control signals DA and DB for setting the values of the load capacitors 2a and 2b according to the comparison result of the comparator 11. A clock CLK, an enable signal EN, and a reset signal XRST are supplied to the control circuit 12. The control circuit 12 resets a circuit state in response to the reset signal XRST, starts a calibration operation in response to the enable signal EN, and performs the calibration operation in synchronization with timing of the clock CLK. In a normal state, the control circuit 12 keeps the control signals DA and DB adjusted by the calibration operation.

FIG. 2 illustrates normal operation states of the switches 6, 7a, 7b, 8a, and 8b. That is, the switch 6 is in an electrical conduction state, and the remaining switches are in an electrical non-conduction state. Since the switch 6 is in the electrical conduction state, the oscillation loop of the oscillation circuit including the inverter circuit 1 and the crystal resonator 4 is formed.

In this state, a short circuit is formed between the input and the output of the inverter 1 by the feedback resistor 3, and DC potentials of the input and the output of the inverter 1 are fixed to approximately a threshold voltage of the inverter 1. When a negative resistance decided by a parameter such as a transconductance gm of the inverter 1 is sufficiently larger than a resonant resistance component of the crystal resonator 4, the oscillation circuit DCXO is triggered by the occurrence of a noise and resonates like a waveform illustrated in FIG. 2. If $L_1$ is defined as a series inductance of the crystal resonator 4, $C_1$ as a series capacitance, $C_0$ as a parallel capacitance, and $2 \times C_L$ as capacitances of load capacitors 2a and 2b, the frequency is as follows:

Crystal resonator series resonant frequency: $Fs=1/(2\pi\sqrt{L_1 \cdot C_1})$ Equation 1, and DCXO resonant frequency with load: $F_L=Fs \cdot (1+(C_1/(2 \cdot (C_0+C_L))))$ Equation 2.

Since it is regarded that the load capacitors 2a and 2b are serially connected to both terminals of the crystal resonator 4, the series capacitance thereof becomes $C_L$. A composite capacitance including the parallel capacitance $C_0$ inside the crystal resonator 4 and the load capacitors 2a and 2b becomes $(C_0+C_L)$.

As described above, the output clock SCK of the oscillation circuit DCXO oscillates at the frequency illustrated in Equation 2, and a value of the frequency is decided depending on the parameters $L_1$, $C_1$, and $C_0$ of the crystal resonator 4 and the load capacitance $C_L$. Since the parameters of the crystal resonator 4 are fixed values specific to components, the frequency of the output clock SCK is variably adjusted by adjusting the capacitance value of the load capacitor $C_L$ of the IC internal circuit 5. That is, an oscillation circuit that variably controls the frequency is implemented by disposing a mechanism for variably setting the load capacitor $C_L$ that is a variable capacitive element.

However, when a manufacturing variation of the load capacitors 2a and 2b integrated inside the IC occurs or when the capacitance values of the load capacitors 2a and 2b vary by the power voltage or the temperature, the resonant frequency $F_L$ greatly deviates from a design value. Further, as described above, the load capacitance $C_L$ is a value including the parasitic capacitance by the I/O circuits inside the IC, a line pattern of an external printed circuit board connected with the terminals 61 and 62, or the like. For this reason, the load capacitance easily varies according to a used I/O circuit, the line length of a printed circuit board, and a material used for it, and this is a cause of the frequency variation.

The circuit 5, which configures the oscillation circuit according to the present embodiment, includes a circuit that measures the capacitances of the load capacitors 2a and 2b and of the parasitic capacitors connected to the load capacitors 2a and 2b in a DC manner. The circuit includes the reference current generating circuit 10, the comparator 11, a group of switches 6, 7a, 7b, 8a, and 8b, the external resistor 9. Through this circuit having this configuration, the load capacitors 2a and 2b and the parasitic capacitors thereof are calibrated to have capacitance values suitable for generating an ideal frequency.

Figure 3:
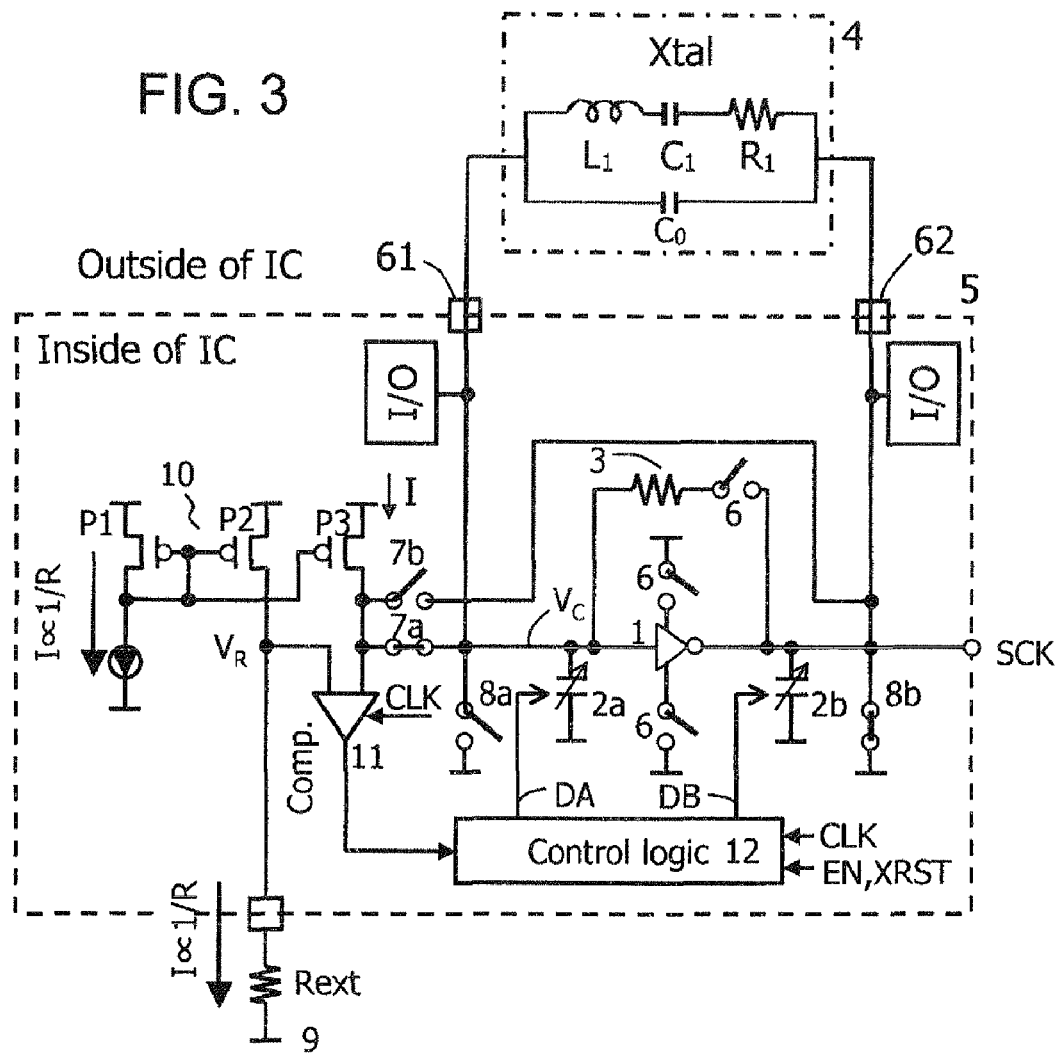
FIG. 3 is a diagram illustrating a calibration operation state of the oscillation circuit illustrated in FIG. 2.
Figure 4:
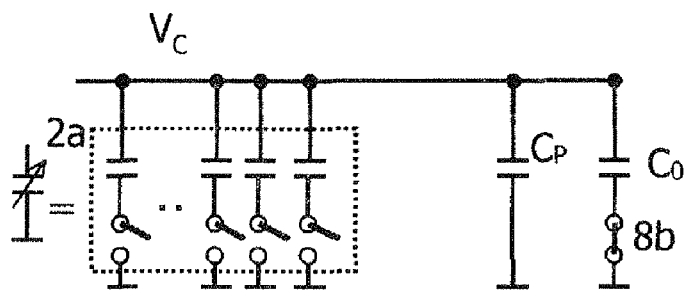
FIG. 4 is a diagram illustrating a configuration of a capacitor at the input terminal side of the inverter 1 illustrated in FIG. 3.

FIG. 3 is a diagram illustrating a calibration operation state of the oscillation circuit illustrated in FIG. 2. FIG. 4 is a diagram illustrating a configuration of a capacitor at the input terminal side of the inverter 1 illustrated in FIG. 3. In the calibration operation, the capacitance value of the capacitor 2a at the input terminal side of the inverter 1 and the capacitance value of the load capacitor 2b at the output terminal side thereof are measured, respectively. The calibration operation is performed as follows during an operation preparation time such as when electrical power is turned on.

First, the switch 6 that connects the oscillation loop of the DCXO 5 and makes power enable is turned off, and the switch 8b for fixing the output terminal of the CMOS inverter 1 to the GND potential is turned on. The switch 8a at the input terminal side is turned on to discharge electric charges of the load capacitor 2a and then immediately turned off. In this state, the input potential and the output potential of the CMOS inverter 1 are connected to the ground GND potential together. Further, as illustrated in FIG. 4, the load capacitor 2a, the parallel capacitor $C_0$ of the crystal resonator 4, the input parasitic capacitor of the CMOS inverter 1, and the parasitic capacitor $C_P$ caused by an I/O cell of the terminal 61 and a line pattern of an external printed circuit board are present between the input terminal of the CMOS inverter 1 and the ground GND. Here, let us define $C_{IN}(=C_{2a}+C_0+C_P)$ as a total capacitance of the input terminal of the CMOS inverter 1.

Next, the switch 7a for supplying the reference current I generated by the reference current generating circuit 10 to the input terminal side of the CMOS inverter 1 is turned on. In this case, an input voltage $V_C$ of the CMOS inverter 1 increases by a gradient $I/C_{IN}$ to a time t as represented by:

$$V_C=I \cdot t/C_{IN}$$

Thus, after one cycle of the clock CLK of the frequency $F_C$ that becomes a certain reference, that is, after a time $t=1/F_C$ elapses, the potential $V_C$ of the input terminal becomes $$V_C=I/(F_C \cdot C_{IN}) \qquad \text{Equation 3}$$

Meanwhile, by allowing the same reference current I to flow to the external resistive component 9 from the reference current generating circuit 10 of FIG. 3, the following reference voltage $V_R$ is obtained:

$$V_R=I \cdot Rext \qquad \text{Equation 4.}$$

Rext is the external component whose resistance value does not depend on the manufacturing variation, the temperature, or the voltage of the IC. A reference voltage generating circuit configured with the transistor P2 for supplying the reference current I and the external resistive component 9 generates the reference voltage $V_R$.

The resistance value of the external resistive component 9, is selected to a value which causes $V_C$ to be equal to $V_R$ at timing when one cycle of the clock CLK (the frequency $F_C$) elapses after the switch 7a is turned on, when the total capacitance $C_{IN}$ of the input terminal of the inverter 1 is an ideal value $C_{IDL}$ ($C_{IN}=C_{IDL}$). That is, in terms of Equations 3 and 4, a value that satisfies Rext=$1/(F_C \cdot C_{IDL})$ is selected.

For example, when the parallel capacitance $C_0$ of the crystal resonator that is already known is 1 pF, $F_C$ is set to 10 MHz, and the capacitance $C_{IN}$ of the input terminal is desired to be set to the ideal capacitance $C_{IDL}$=10 pF, 10 kΩ is selected as Rext.

The external resistor Rext is selected as described above, and the switch 7a is turned on, so that, in accordance with the reference current I, the input terminal of the inverter 1 starts to be charged. Then, after one cycle (1/Fc) of the clock CLK elapses, the potential of $V_C$ is compared with the potential of $V_R$. In this way, a deviation of an actually manufactured load capacitor from the ideal design value $C_{IDL}$ is detected in a DC manner.

That is, when the reference current I is removed from Equations 3 and 4 and the ideal capacitance expected as the ideal design value is set to $C_{IDL}$, if Rext=$1/(Fc \cdot C_{IDL})$ is considered, following Equation 5 is obtained:

$$V_C/V_R = 1/(Fc \cdot C_{IN}) \cdot Rext = (Fc \cdot C_{IDL})/(Fc \cdot C_{IN}) = C_{IDL}/C_{IN} \quad \text{Equation 5}$$

Equation 5 means that $V_C > V_R$ when $C_{IN} < C_{IDL}$ and $V_C < V_R$ when $C_{IN} > C_{IDL}$. That is, it means that it is judged whether or not the actually manufactured capacitance $C_{IN}$ is larger than the ideal capacitance $C_{IDL}$ through the magnitude relationship of Vc and $V_R$.

Figure 5:
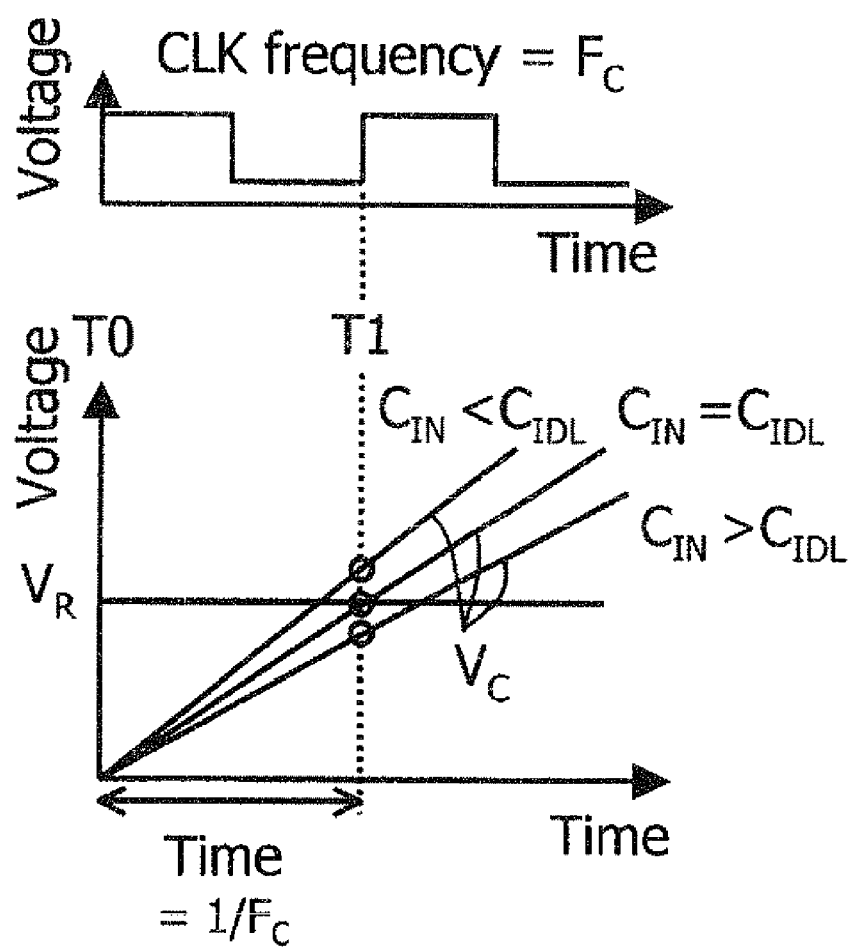
FIG. 5 is a timing diagram of a calibration operation according to the first embodiment.

FIG. 5 is a timing diagram of a calibration operation. The switch 7a is turned on at a time T0, the comparator 11 outputs a comparison result between the potential (the charging voltage) Vc of the input terminal of the inverter 1 and the reference voltage $V_R$ at timing T1 when one cycle=1/Fc of the clock CLK elapses. It is seen from FIG. 5 that the comparison result is Vc>$V_R$ when $C_{IN}<C_{IDL}$, the comparison result is Vc<$V_R$ when $C_{IN}>C_{IDL}$, and the comparison result is Vc=$V_R$ when $C_{IN}=C_{IDL}$.

The capacitance value of the load capacitor 2a of FIG. 4 changes by digitally controlling the number of turned-on switches. The control circuit 12 performs control for increasing or decreasing the number of turned-on switches by the control code DA so that the input voltage Vc of the inverter 1 become close to the reference voltage $V_R$ based on the judgment of the comparator 11. The switch control may be performed such that the number of turned-on switches is controlled through binary search by a multi-bit control signal and a decoder.

Comparison timing by the comparator 11 need not be necessarily timing when one cycle of the clock CLK elapses after charging starts, and timing when N cycles (N is an integer larger than 2) elapse may be selected.

The control circuit 12 obtains the optimum number of turned-on switches such that the potential of the input voltage Vc of the inverter 1 becomes as close to the reference voltage $V_R$ as possible, by repeating the comparison operation and the switch control operation multiple times.

After the number of turned-on switches of the variable capacitive element 2a is obtained, setting information (the control code DA) of turned-on switches is saved in a register inside the control circuit 12, and then a similar calibration operation is performed even on the output side of the CMOS inverter 1. That is, by replacing the switch 7a with the switch 7b, the switch 8a with the switch 8b, and the load capacitor 2a with the load capacitor 2b, a similar comparison operation and a similar switch control operation are performed. When detection at the output side is finished, setting information (the control code DB) is similarly saved in the register inside the control circuit 12, and transition to the normal operation illustrated in FIG. 2 is performed by turning the switch 6 on and turning switches 7a, 7b, 8a, and 8b off.

As understood from Equation 5, since the same reference current I is used for generation of the voltages Vc and $V_R$, the comparison result between the voltages Vc and $V_R$ is measured with a high degree of accuracy without depending on the magnitude or variation of the reference current I of the reference current generating circuit 10. Further, since the capacitance values $C_{IN}$ of the input terminal and the output terminal of the CMOS inverter 1 are independently detected/adjusted, for example, even though the parasitic capacitance of the external printed circuit board or the parasitic capacitance between a gate and a source of the CMOS inverter at the input side is different from that at the output side, the capacitance at the input side and the capacitance at the output side is set to be close to the ideal design capacitance values, respectively.

Second Embodiment

Figures 6A, 6B:
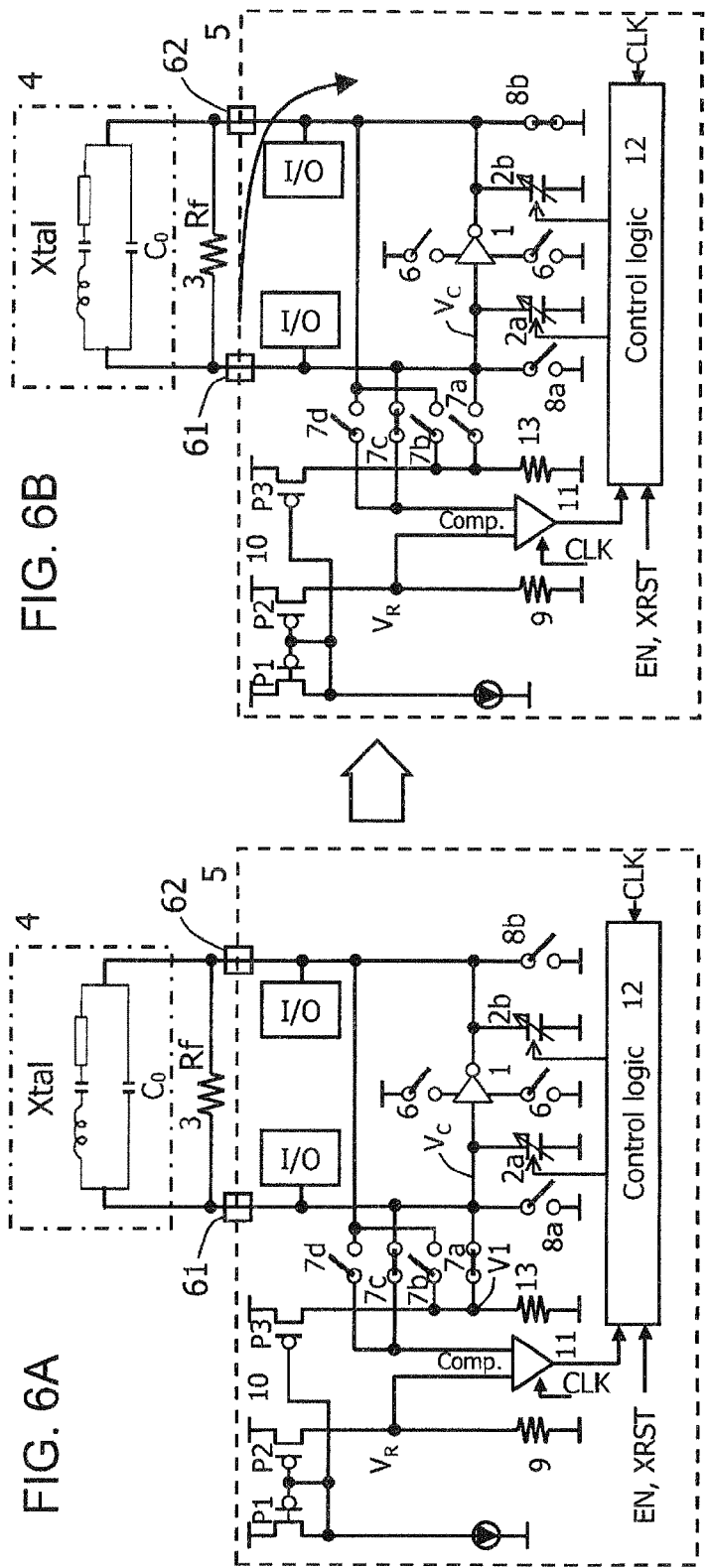
FIGS. 6A and 6B are circuit diagrams of an oscillator according to a second embodiment.

FIGS. 6A and 6B are circuit diagrams of an oscillator according to a second embodiment. Similarly to FIGS. 2 and 3, FIGS. 6A and 6B illustrate a crystal resonator 4 and a circuit 5 connected to the external crystal resonator 4 and disposed inside an IC chip that configures the oscillation circuit DCXO. The same circuit components as in FIGS. 2 and 3 are denoted by the same reference numerals.

A configuration of FIGS. 6A and 6B is different from the configuration of FIGS. 2 and 3 in that an external component resistor 3 is disposed instead of the internal feedback resistor 3 that has been interposed between the input and the output of the CMOS inverter 1, and as an IC internal resistor 9 is disposed instead of the external resistor component 9 for generating the reference voltage $V_R$. Further, disposed are switches 7a and 7b for supplying the input and the output of the CMOS inverter 1 with a bias potential (a first potential) $V_1$, a resistor 13 for generating the bias potential $V_1$, and switches 7c and 7d that connect the input and the output of the CMOS inverter 1 with the comparator 11, respectively.

In addition, a first voltage generating circuit that generates the first voltage (the bias potential) $V_1$ is configured with a transistor P3 of the reference current generating circuit 10 and the internal resistor 13. Further, a second voltage generating circuit that generates the reference voltage $V_R$ is configured with a transistor P2 and the internal resistor 9.

In the second embodiment, similarly to the first embodiment, the input potential of the CMOS inverter 1 is defined as $V_C$, and a description will be made in connection with a calibration operation for detecting/adjusting the capacitance value of the load capacitor 2a at the input side of the CMOS inverter 1. The calibration operation is performed during an operation preparation time such as when electrical power is turned on.

Figure 7:
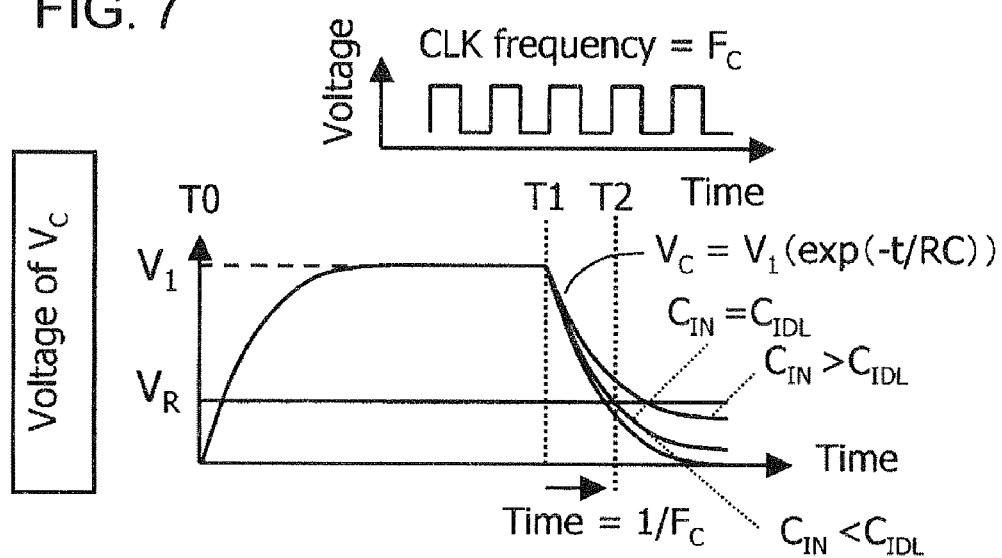
FIG. 7 is a timing diagram of a calibration operation according to the second embodiment.

FIG. 7 is a timing diagram of a calibration operation according to the second embodiment.

First, at a time T0 of FIG. 7, as illustrated in FIG. 6A, the switch 6 that connects the oscillation loop of the oscillator and makes electrical power enable is turned off, and the switch 7a for applying the bias potential $V_1$ to the input terminal of the CMOS inverter 1 and the switch 7c for supplying the input of the comparator 11 with the input terminal voltage $V_C$ of the inverter 1 are turned on. In this state, the switches 8a and 8b for fixing the input and the output of the CMOS inverter 1 to the GND potential are in an OFF state. Thus, there is no path through which electric charges from the input and output terminals of the CMOS inverter 1 are discharged, and the potential $V_C$ of the input terminal of the CMOS inverter 1 is raised to the bias potential $V_1$ decided by the reference current I of the reference current generating circuit 10 and the IC internal resistor 13. That is, the load capacitor 2a of the input terminal of the inverter 1 and the parasitic capacitor thereof are charged to the bias potential $V_1$, so that $V_C$ becomes equal to $V_1$.

Next, at a time T1 of FIG. 7, as illustrated in FIG. 6B, the switch 7a is turned off, and the switch 8b for fixing the output terminal of the CMOS inverter 1 to the GND potential is turned on. Thus, formed is a path through which electric charges are discharged from the input terminal of the CMOS inverter 1 to the GND potential via the external resistor 3 and the switch 8b. As a result, the voltage $V_C$ of the input terminal of the inverter 1 is lowered by discharging.

If $R_f$ is defined as a resistance value of the external resistor 3 and $C_{IN}$ ($=C_{2a}+C_0+C_P$) as a total capacitance viewed at the input terminal of the CMOS inverter 1, the potential $V_C$ of the input terminal decreases from the bias potential (the first voltage) V1 according to a time constant of $R_f C_{IN}$ as a time goes by when the switch 8b is turned on. The potential $V_C$ of the input terminal decreases as $V_C = V_1(\exp(-t/R_f C_{IN}))$.

Thus, when one cycle of the clock CLK (the frequency $F_C$) that becomes a reference elapses, that is, at a time T2 after $t=1/F_C$, the potential $V_C$ of the input terminal becomes $V_1 = \exp(-1/(F_C \cdot R_f C_{IN}))$.

If $C_{IDL}$ is an ideal capacitance expected as the design value, when $C_{IN} < C_{IDL}$, the potential $V_C$ is lower than when $C_{IN} = C_{IDL}$, and when $C_{IN} > C_{IDL}$, the potential $V_C$ is higher than when $C_{IN} = C_{IDL}$. That is, when $C_{IN} < C_{IDL}$, since the charge quantity by the bias voltage $V_1$ is small, the potential drop of the potential $V_C$ after one cycle of the clock CLK is large, whereas when $C_{IN} > C_{IDL}$, since the charge quantity is large, the potential drop of the potential $V_C$ is small. Thus, by monitoring the potential at a time T2 after discharging starts, a relative magnitude of the IC internal capacitance $C_{IN}$ to the ideal capacitance $C_{IDL}$ will be measured.

The comparator 11 compares the potential (the discharging voltage) $V_C$ of the input terminal with the previously set reference potential $V_R$ at certain timing. In order to make the potential $V_C$ obtained after one cycle t(=1/Fc) of the clock CLK equal to the reference potential $V_R$ when the total capacitance $C_{IN}$ of the input terminal is equal to the ideal capacitance $C_{IDL}$, the resistance value $R_f$ of the feedback resistor 3 is preferably set as follows. In order to satisfy $V_R = V_C = V_1(\exp(-1/(Fc \cdot R_f \cdot C_{IN})))$, the resistance value $R_f$ of the feedback resistor is preferably set as in Equation 6:

$$R_f = 1/(F_C \cdot C_{IN} \cdot \ln(V_1/V_R))$$  Equation 6

The parameters $F_C$, $V_1$, $V_R$, and $R_f$ are decided according to the ideal value $C_{IDL}$ of the capacitance $C_{IN}$ of the input terminal that is desired to set or an operation condition (the speed or a dynamic range) of the comparator so that Equation 6 will be true. For example, when the capacitance $C_{IN}$ of the input terminal is set to 11 pF, if $F_C$ is 2 MHz, $V_1$ is 1.0 V, and $V_R$ is 0.4 V, Rf≈50 kΩ is preferable in terms of Equation 6. The resistance value $R_f$ of the external resistor 3 will be set with a high degree of accuracy.

In the calibration operation, as illustrated in FIG. 7, the comparator 11 compares with the potential $V_C$ with the reference voltage $V_R$ at timing when the clock CLK rises to a high level, and the control circuit 12 controls the control code DA based on the comparison result. That is, similarly to the first embodiment, the control circuit 12 performs control so that the capacitance value of the load capacitor 2a is equal to the ideal value by changing the control code DA for increasing or decreasing the number of turned-on switches of the load capacitor 2a so that the comparison result becomes close to $V_C = V_R$.

Timing by the comparator 11 need not necessarily be timing when one cycle of the clock CLK elapses after charging starts, and timing may be selected so that Equation 6 will be true.

After the number of turned-on switches is obtained, setting information such as the control code DA is saved in the register inside the control circuit. Then, a similar calibration operation is performed even on the load capacitor 2b at the output side of the CMOS inverter 1. That is, by replacing the switch 7a with the switch 7b, the switch 7c with the switch 7d, the switch 8a with the switch 8b, and the load capacitor 2a with the load capacitor 2b, a similar comparison process and similar control of the control code DB are performed. When the control code DB of the load capacitor 2b at the output terminal is decided, setting information thereof is saved in the register inside the control circuit. Then, transition to the normal operation is performed by turning the switch 6 on and turning switches 7a to 7d, 8a, and 8b off.

In the first embodiment, the potential $V_C$ is measured during the charging operation of the load capacitors 2a and 2b, whereas in the second embodiment, the potential $V_C$ is measured during the discharging operation of the load capacitors 2a and 2b. In the second embodiment, as seen from the Equation 6, when the resistance value $R_f$ of the external feedback resistor 3 has a high degree of accuracy, it is detected with a high degree of accuracy whether or not the capacitances $C_{IN}$ of the input and output terminals of the inverter 1 are equal to the ideal capacitance $C_{IDL}$. Further, even in the second embodiment, since the bias potential (the first voltage) $V_1$ and the reference potential $V_R$ which are set in advance are generated based on the reference current value I of the reference current generating circuit 10 and the IC internal resistors 13 and 9, respectively, the comparator 11 performs a comparison operation with a high degree of accuracy regardless of a variation in the reference current value I.

Third Embodiment

Figure 8:
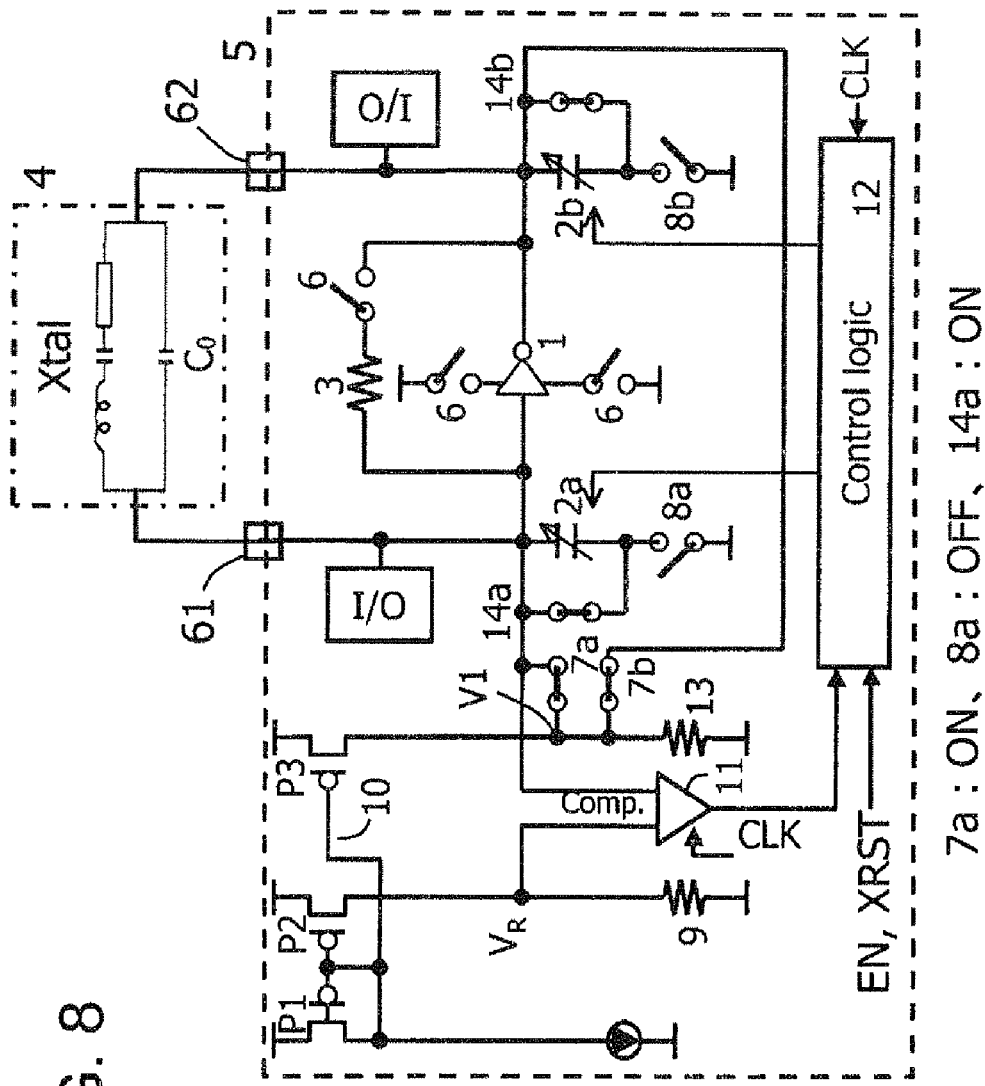
FIG. 8 is a circuit diagram of an oscillation circuit according to a third embodiment at the first timing.
Figure 9:
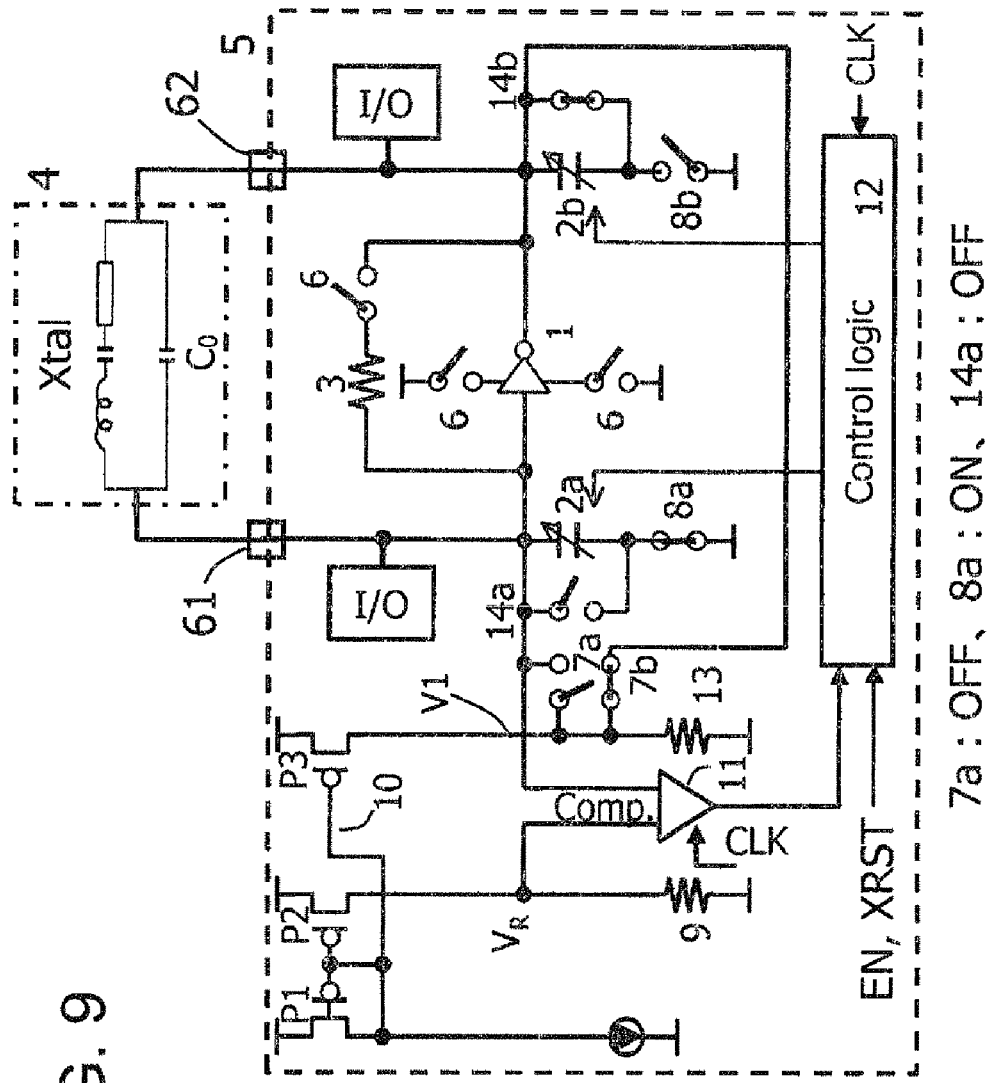
FIG. 9 is a circuit diagram of an oscillation circuit according to a third embodiment at the second timing.

FIGS. 8 and 9 are circuit diagrams of an oscillation circuit according to a third embodiment. Similarly to FIGS. 6A and 6B, FIGS. 8 and 9 illustrate a crystal resonator 4 that configures the oscillation circuit DCXO and a circuit 5 which is connected to the external crystal resonator 4 and disposed inside an IC chip. The same circuit components as in FIGS. 6A and 6B are denoted by the same reference numerals.

A configuration of FIGS. 8 and 9 is different from the configuration of FIGS. 6A and 6B in that an IC internal resistor 3 is disposed instead of the external resistive element 3 interposed between the input and the output of the CMOS inverter 1, a switch 14a that causes a short circuit between the terminals of the load capacitor 2a and a switch 14b that causes a short circuit between the terminals of the load capacitor 2b are added. Further, the switches 7c and 7d that connect the input and output terminals of the CMOS inverter 1 with the input of the comparator 11, respectively, are removed.

In addition, a first voltage generating circuit that generates the first voltage (the bias potential) $V_1$ is configured with the transistor P3 of the reference current generating circuit 10 and the internal resistor 13. Further, a second voltage generating circuit that generates the reference voltage $V_R$ is configured with the transistor P2 and the internal resistor 9.

A description will be made below in connection with a calibration operation of detecting and adjusting the capacitance value of the load capacitor 2a at the input terminal side of the CMOS inverter 1.

As illustrated in FIG. 8, the switch 6 that connects the oscillator loop and makes electrical power enable is turned off, and the switches 7a and 7b for applying the bias potential (the first voltage) $V_1$ to the input and output terminals of the CMOS inverter 1 and the switches 14a and 14b for causing short circuits between the terminals of the load capacitors 2a and 2b, respectively, are turned on. In this state, a portion between both terminals of the parallel capacitor $C_0$ of the crystal resonator and a portion between terminals of the load capacitor 2a and the parasitic capacitor $C_P$ are fixed to the bias potential $V_1$.

Figure 10B:
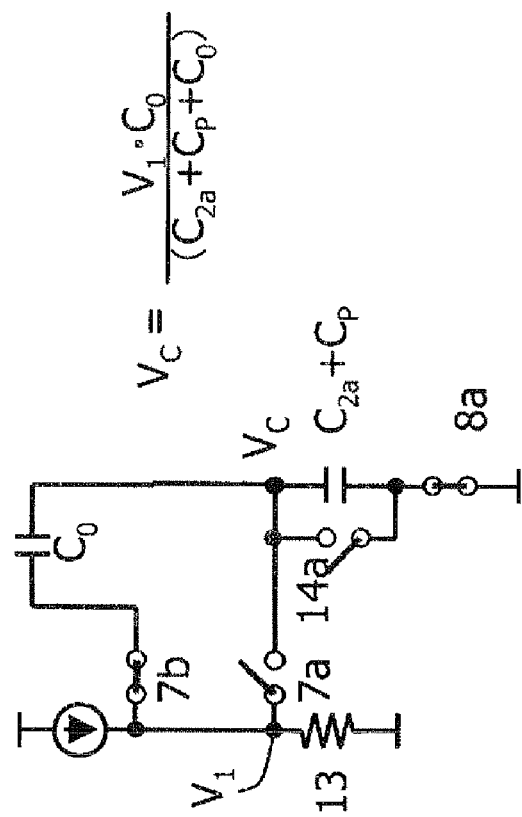
FIGS. 10A and 10B are equivalent circuit diagrams in a calibration operation of FIGS. 8 and 9, respectively.
Figure 10A:
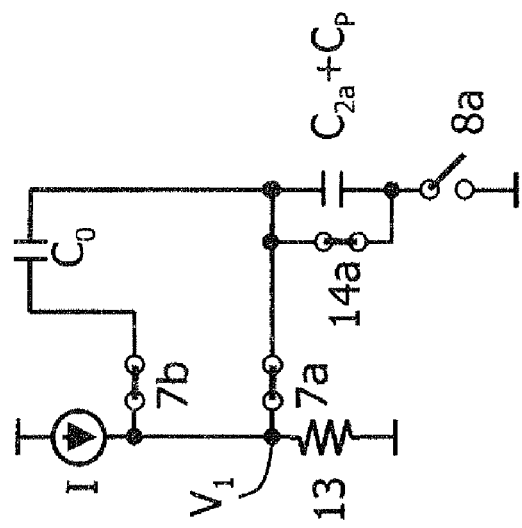
Figure 11:
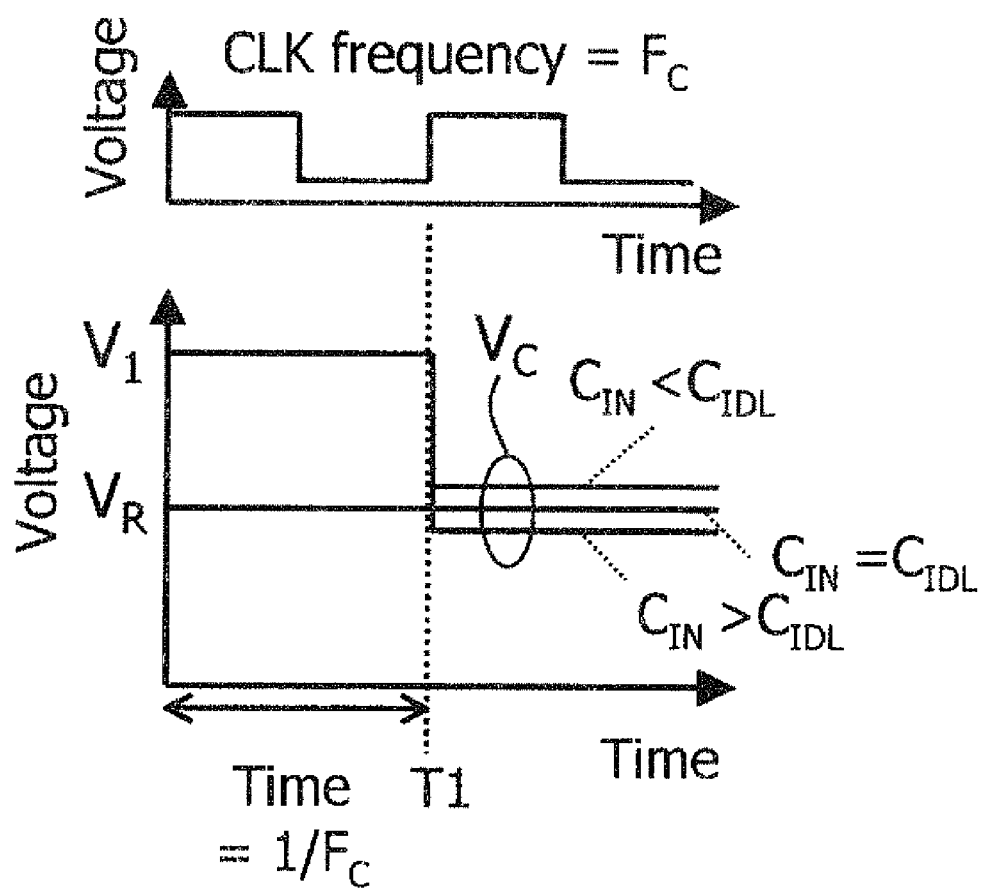
FIG. 11 is a timing diagram of a calibration operation according to the third embodiment.

FIGS. 10A and 10B are equivalent circuit diagrams in a calibration operation of FIGS. 8 and 9, respectively. FIG. 11 is a timing diagram of a calibration operation. As shown in FIG. 10A, the charge quantity of the capacitors around $C_0$, $C_P$ and $C_{2a}$ are zero in the FIG. 8 connection.

Next, at a time T1 of FIG. 11, as illustrated in FIGS. 9 and 10B, the switches 7a and 14a are turned off, and the switch 8a is turned on. As a result, the parallel capacitor $C_0$ of the crystal resonator, the load capacitor 2a, and the parasitic capacitor $C_P$ are serially connected between the bias potential $V_1$ and the ground GND. Since charge injection from the outside or discharging to the outside is not performed when a state of FIG. 10A changes to a state of FIG. 10B, the charge quantity (=0) of FIG. 10A is equal to the charge quantity of FIG. 10B due to the principle of charge conservation, and thus the following equation is true:

$$0 = V_C \cdot (C_{2a} + C_P) + (V_C - V_1) \cdot C_0$$

If this equation is solved, the potential $V_C$ of the CMOS inverter 1 that is a serially connected intermediate node is as follows:

$$V_C = V_1 \cdot C_0 / (C_{2a} + C_0 + C_P) = V_1 \cdot C_0 / C_{IN} \qquad \text{Equation 7}$$

This means that the potential $V_C$ changes from the bias potential (the first voltage) $V_1$ to $V_1 \cdot C_0/C_{IN}$ when the switches are switched from a state of FIG. 10A (FIG. 8) to a state of FIG. 10B (FIG. 9) and means that the total capacitance $C_{IN}$ of the input terminal relative to the ideal capacitance value $C_{IDL}$ will be detected when the equivalent parallel capacitance value $C_0$ of the crystal resonator that is an external component is fixed. If $C_{IDL}$ is the ideal capacitance expected as the design value, the potential $V_C$ of the input terminal after switching of the switches is higher than when $C_{IN}=C_{IDL}$ if $C_{IN}<C_{IDL}$ and is lower than when $C_{IN}=C_{IDL}$ if $C_{IN}>C_{IDL}$.

The comparator 11 compares the potential $V_C$ with the previously set reference potential $V_R$. For example, in the case of desiring to set $C_{IN}$ to 11 pF using the crystal resonator in which $C_0$ is 1 pF, the reference voltage $V_R$ is set so that $V_R=V_1 \cdot C_0/C_{IN}=V_1/11$ is true. That is, when an operation is performed at the potential $V_1$ of 1.1 V, the resistance values of the IC internal resistors 13 and 19 and the current value of the current source circuit 10 are decided so that $V_R$ will be 0.1 V.

The comparator 11 compares the potential $V_C$ with the potential $V_R$ at arbitrary timing after switching of the switches at the time T1. Similarly to the first and second embodiments, based on the comparison result of the comparator 11, the control circuit 12 performs control so that the total capacitance $C_{IN}$ of the input terminal of the inverter will be close to the ideal capacitance $C_{IDL}$ by increasing or decreasing the number of turned-on switches of the load capacitor 2a that is a variable capacitive element and so changing the value of the load capacitor 2a. That is, the control circuit 12 sets the control code DA so that the potential $V_C$ will be almost equal to the potential $V_R$.

After the number of turned-on switches is obtained, setting information such as the control code DA is saved in the register inside the control circuit 12. Then, a similar calibration operation is performed even on the output side of the CMOS inverter 1. That is, by replacing the switch 7a with the switch 7b, the switch 8a with the switch 8b, the switch 14a with the switch 14b, and the load capacitor 2a with the load capacitor 2b, a similar comparison and similar setting of the control code are performed. When the control code detection operation at the output terminal side is finished, similarly, setting information thereof is saved in the register inside the control circuit. Then, transition to the normal operation is performed by turning the switch 6 on and turning switches 7a, 7b, 8a, 8b, 14a, and 14b off.

In the third embodiment, since the capacitance value is relatively detected according to a potential change by movement of electric charges, when the parallel capacitance value $C_0$ of the external crystal resonator does not greatly vary, the capacitance value $C_{IN}$ will be adjusted with a high degree of accuracy. Further, in the present embodiment, the case of using the operation clock CLK has been described, but since the potential $V_C$ is maintained at a certain potential after switching of the switches as illustrated in FIG. 11, comparison timing of the comparator may be arbitrary timing after switching of the switches. Thus, the calibration operation may be performed using a combination logic circuit without using a high-accuracy clock CLK.

[First Modification]

Figure 12:
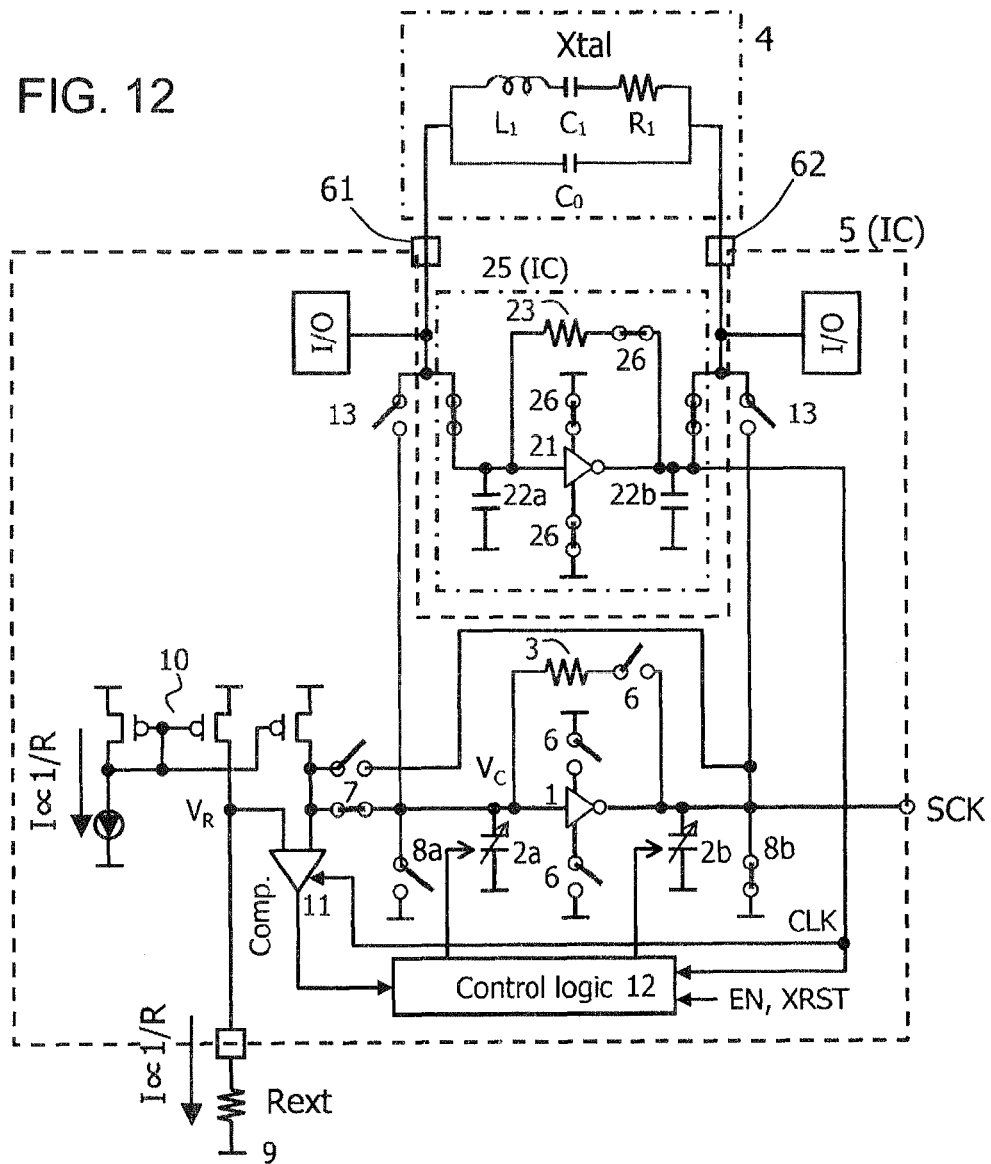
FIG. 12 is a diagram illustrating a modified circuit of the first and second embodiments.

FIG. 12 is a diagram illustrating a modified circuit of the first and second embodiments. In the first embodiment, the comparison operation is performed at timing when one cycle or N cycles of the clock CLK elapse after charging starts, whereas in the second embodiment, the comparison operation is performed at timing when one cycle or N cycles of the clock CLK elapse after discharging starts. For this reason, the clock CLK needs to be supplied from any place.

In the modified circuit of FIG. 12, a circuit 25 that includes a second inverter 21, a second feedback resistor 23, and load capacitors 22a and 22b that configures the oscillation circuit together with the crystal resonator 4 is further disposed inside the IC. As switches 13 disposed on the terminals 61 and 62, one at the circuit 25 side is turned on and one at the circuit 5 side off, the crystal oscillator is configured with the crystal resonator 4 and the circuit 25, and the clock CLK generated by the crystal oscillator is supplied as a reference clock of the control circuit 12 inside the circuit 5. Also, the clock CLK is supplied to the comparator 11.

The circuit 5 of FIG. 12 is the same as the circuit 5 according to the first embodiment but may be the same as that according to the second embodiment. In this case, the clock CLK in the second embodiment is used as the reference clock of the calibration operation.

The circuit 25 includes the CMOS inverter 21, the internal capacitors 22a and 22b that are connected to the input and the output of the CMOS inverter 21, respectively, a resistive element 23 that is interposed between the input and the output of the CMOS inverter 21 and serves to make the DC potentials of the input be equal to the DC potential of the output, and a switch 26 that connects the oscillation loop of the oscillation circuit with the resonator 4 and makes electrical power enable.

In this modified circuit, the clock CLK in the first or second embodiment is generated by the oscillation circuit including the circuit 25 inside the IC and the crystal resonator 4. That is, when the calibration operation is performed during the operation preparation time such as when electrical power is turned on, the oscillation circuit configured with the crystal resonator 4 and the circuit 25 by a connection illustrated in FIG. 12 oscillates. That is, the switch 6 is turned off, the switch 26 is turned on, and the switches 13 are controlled to connect the crystal resonator 4 with the circuit 25. The oscillation circuit configured with the crystal resonator 4 and the circuit 25 starts to oscillate, and the clock CLK output from the oscillation circuit is input to the comparator 11 and the control circuit 12. Thus, the calibration operation is performed by the circuit inside the IC without being supplied with the clock from the outside.

The load capacitors 22a and 22b inside the circuit 25 are preferably fixed capacitors for oscillation, and the capacitance value thereof does not require a degree of absolute accuracy. This is because even if the load capacitors 22a and 22b have been manufactured to have values greatly deviated from design values and the clock CLK has been deviated from the ideal frequency by 100 ppm, an error of the potential $V_C$ of Equation 3 is mere 0.01% on the ideal clock frequency, and thus it is sufficient as a degree of accuracy of the clock used at the time of capacitance correction.

After calibration of the load capacitance according to the first or second embodiment using the clock CLK is performed, transition to the normal operation is performed by turning the switch 6 on, turning the switch 26 off, and controlling the switch 13 so that the crystal resonator 4 is connected with the circuit 5.

[Second Modification]

Figure 13A:
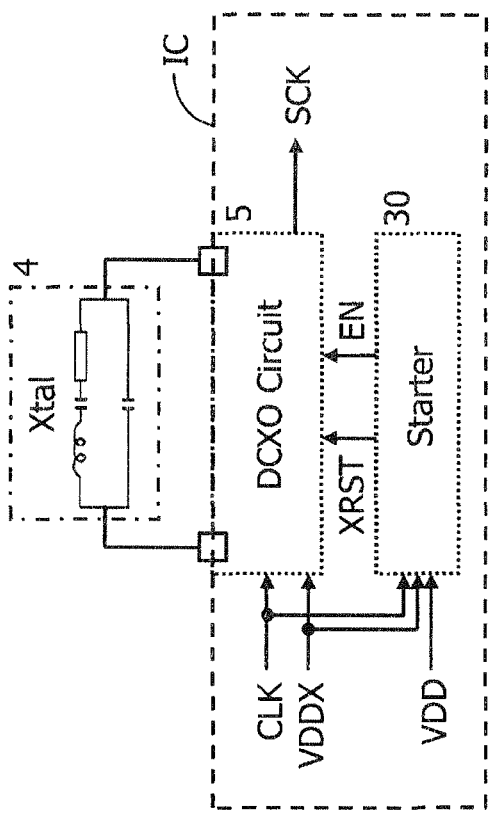
FIGS. 13A and 13B are diagrams illustrating a modified circuit of the first to third embodiments.
Figure 13B:
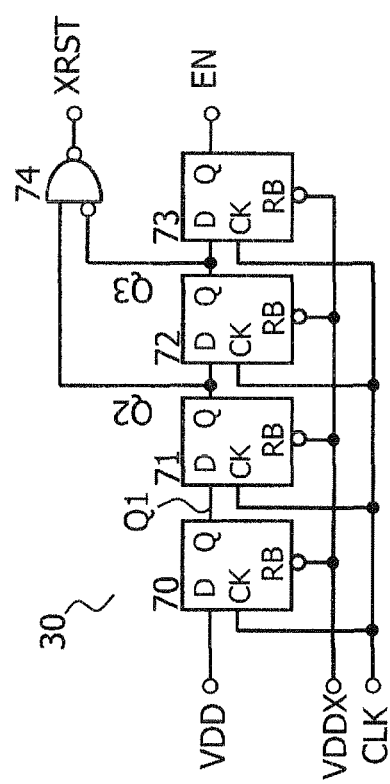
Figure 14:
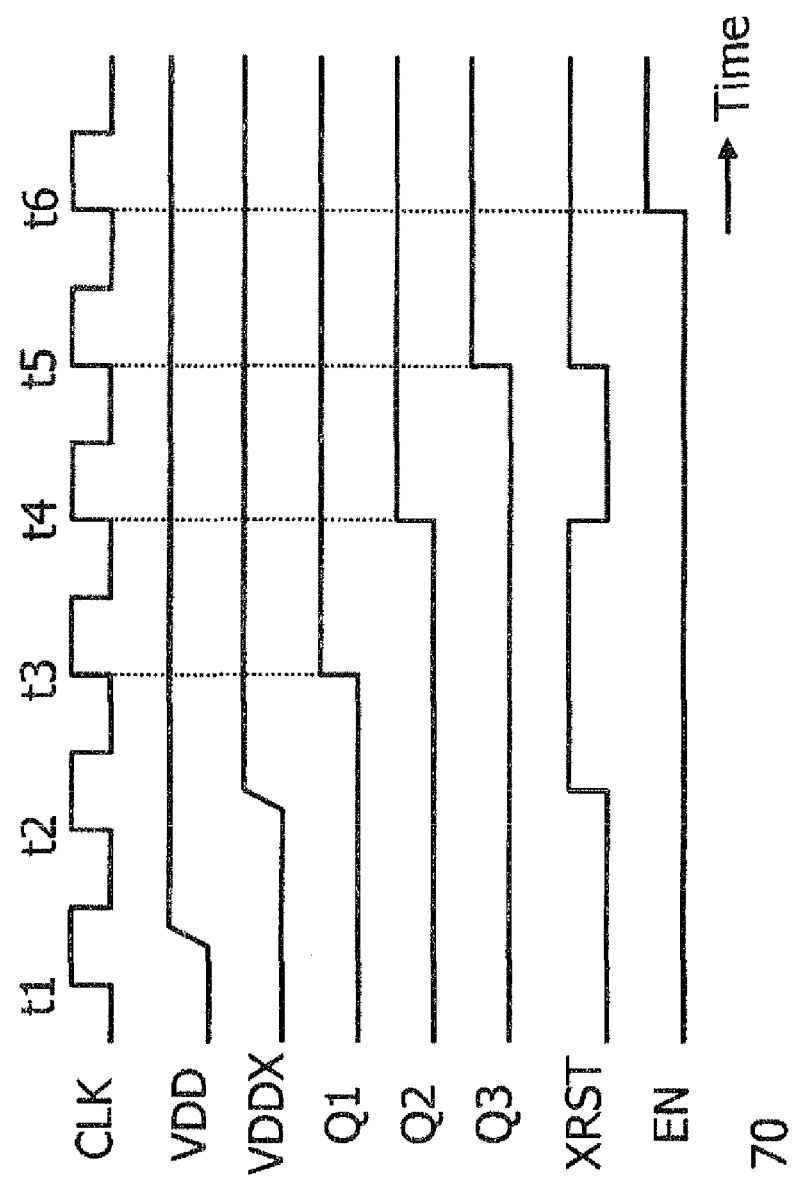
FIG. 14 is a timing diagram of the circuit illustrated in FIG. 13A.

FIGS. 13A and 13B are diagrams illustrating a modified circuit of the first to third embodiments. FIG. 14 is a timing diagram of the circuit illustrated in FIG. 13A.

In the second modification, as illustrated in FIG. 13A, in addition to the circuit 5 of the oscillation circuit other than the crystal resonator, a starter circuit 30 is disposed inside the IC chip. The clock CLK and a power voltage VDDX are supplied to the circuit 5 from a power regulator (not illustrated), whereas the clock CLK and two power voltages VDD and VDDX are supplied to the starter circuit 30 from the power regulator. The power regulator first starts a first power voltage VDD at the time of power activation and then starts a second power voltage VDDX. Using a sequence of two power voltages VDD and VDDX, the starter circuit 30 generates the reset signal XRST before the calibration operation starts and the enable signal EN for controlling the calibration start and supplies the circuit 5 with these signals.

Further, the starter circuit 30 illustrated in FIG. 13B is a shift register including flip flop circuits 70 to 73. The first power voltage VDD is input to a data terminal D of the flip flop circuit 70, the second power voltage VDDX is input to reset terminals RB of the flip flop circuit 70 to 73, and the clock CLK is supplied to clock terminals. Further, outputs Q2 and Q3 of the second and third flip flop circuits are input to an NAND gate 74.

As illustrated in an operation diagram of FIG. 14, before power is activated, the reset signal XRST and the enable signal EN have the low level. If the first power voltage VDD transitions to the high level at the same time when system power is activated and then the second power voltage VDDX transitions to a high level (at a time t2), the flip flop circuits are once reset, the output Q2 and Q3 have the low level, and the reset signal XRST of the high level is output from the AND gate 74. Then, at a time t3 of the clock CLK, the output Q1 transitions to the high level, and at a time t4, the output Q2 transitions to the high level, and the output Q3 has the low level. Thus, at the time t4, the NAND gate outputs the reset signal XRST of the low level. The reset signal XRST of the low level resets the inside of the circuit 5.

In addition, at a time t5, the output Q3 transitions to the high level, and the NAND gate outputs the reset signal XRST of the high level, so that the reset is released. Finally, at a time t6, the output Q of the flip flop 73 transitions to the high level, and so the enable signal EN transitions to the high level. In response to this, the circuit 5 starts the calibration operation. In the calibration operation, as described above, control of a group of switches according to each of the first to third embodiments starts.

According to this modified circuit, by disposing the starter circuit 30 inside the IC, a self calibration operation is performed without complicated control from the outside.

[Third Modification]

Figure 15A:
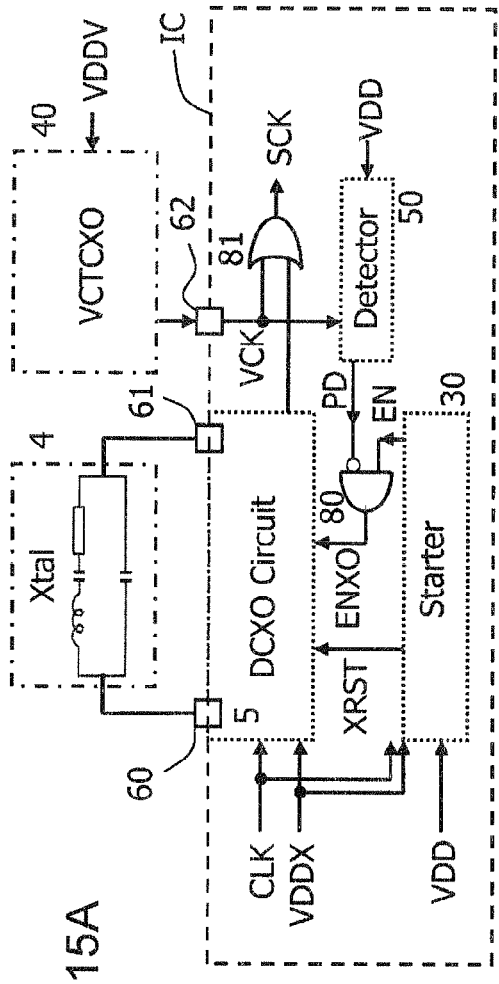
FIGS. 15A and 15B are diagrams illustrating another modified circuit of the first to third embodiments.
Figure 15B:
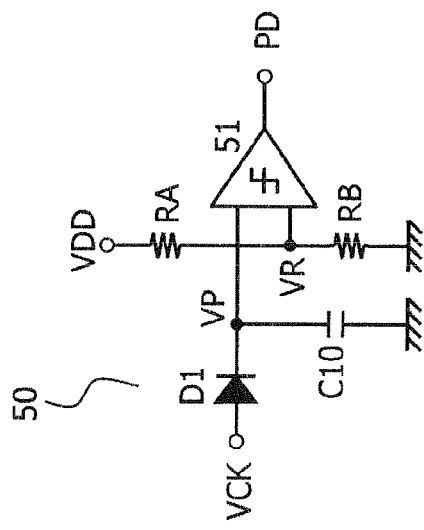

FIGS. 15A and 15B are diagrams illustrating another modified circuit of the first to third embodiments.

In this modified circuit, as illustrated in FIG. 15A, the IC chip includes the circuit 5 of the oscillation circuit DCXO other than the crystal resonator 4 and the starter circuit 30. In addition, a terminal 62 for receiving a clock of a second oscillation circuit element 40 such as VCTCXO is disposed inside the IC chip. Inside the IC chip, disposed is a clock detector circuit 50 that detects whether or not a clock VCK has been supplied to the terminal 62. Further, an OR gate 81 outputs either the clock VCK from the oscillation circuit element 40 or the clock from the oscillation circuit DCXO configured with the crystal resonator 4 and the circuit 5 as a generation clock SCK. The clock SCK is used as the reference clock of the PLL synthesizer inside the RF circuit.

Further, the enable signal EN of the starter circuit 30 is gated by an AND gate 80 according to a logic level of a detection signal PD of the clock detector circuit 50 and supplied to the circuit 5 as an enable signal ENXO for the oscillation circuit DCXO. The starter circuit 30 is the same as in the second modified circuit illustrated in FIGS. 13A, 13B, and 14.

In this modification, any one of two oscillation circuits, that is, any one of the oscillation circuit DCXO (the crystal resonator 4 and the circuit 5) and the oscillation circuit element 40 such as the oscillation circuit VCTCXO may be arbitrarily selected. Further, switching is performed depending on whether the crystal resonator 4 or the oscillation circuit element 40 is connected as an external component to the IC chip, without using electrical control from the outside.

For example, when it is desired to manufacture a portable terminal of a low cost even though an initial variation of the clock SCK is large and a degree of accuracy is low, the clock of the oscillation circuit DCXO is used by connecting the crystal resonator 4. Further, when it is desired to manufacture a portable terminal in which an initial variation of the clock SCK is small and a degree of accuracy is high, an expensive oscillation circuit element 40 such as VCTCXO is connected and used. Through the configuration capable of selecting the external component of the oscillator and connecting it with the IC chip, an oscillation circuit according to a customer's specification is configured by the same circuit, the same chip configuration, the same system, and the same software. By providing general versatility as described above, the cost will be reduced.

The external oscillator 40 outputs the clock VCK when the power voltage VDDV is supplied from a power management module. The clock detector circuit 50 includes a diode D1, a capacitor C10, resistors RA and RB, and a comparator 51 as illustrated in FIG. 15B. The clock detector circuit 50 outputs the detection signal PD of a high level when the clock VCK is input from the oscillator 40 but outputs that of a low level when the clock VCK is not input from the oscillator 40.

The potential of a node VP inside the clock detector circuit 50 is raised by an electric current from the diode D1 when the clock VCK is input, but is not raised when the clock VCK is not input because the diode D1 does not allow an electric current to flow. The comparator 51 is a circuit that outputs the detection signal PD of a high level when the potential of the internal node VP is higher than the potential of the bias voltage VR (for example, VR=VDD/2). Thus, the comparator 51 outputs the signal of the high level at a point in time when the potential of the node VP exceeds the internal bias voltage VR if the clock VCK is input, but outputs the signal of the low level when the clock VCK is not input.

The enable signal ENXO input to the circuit 5 of the oscillation circuit DCXO is generated by NAND gate that inputs an inversion of a logic level of the detection signal PD of the clock detector circuit 50 and the enable signal EN generated by the starter circuit 30 through the AND gate 80. That is, when the oscillator 40 is connected, since the detection signal PD becomes a high level by the clock VCK generated by the oscillator 40, even if the enable signal EN from the starter circuit 30 has a high level, the enable signal ENXO becomes a low level, so that the circuit 5 of the oscillation circuit DCXO does not operate. Further, when the crystal resonator 4 is connected, the clock VCK is not input, and the detection signal PD remains a low level. For this reason, the enable signal EN from the starter circuit 30 becomes the enable signal ENXO "as is", and the calibration operation of the circuit 5 starts by the enable signal ENXO. The output clock SCK is obtained by OR gate that inputs the clock VCK from the oscillator (for example, VCTCXO) 40 and the clock from the circuit 5 that configures the oscillation circuit DCXO.

Figure 16:
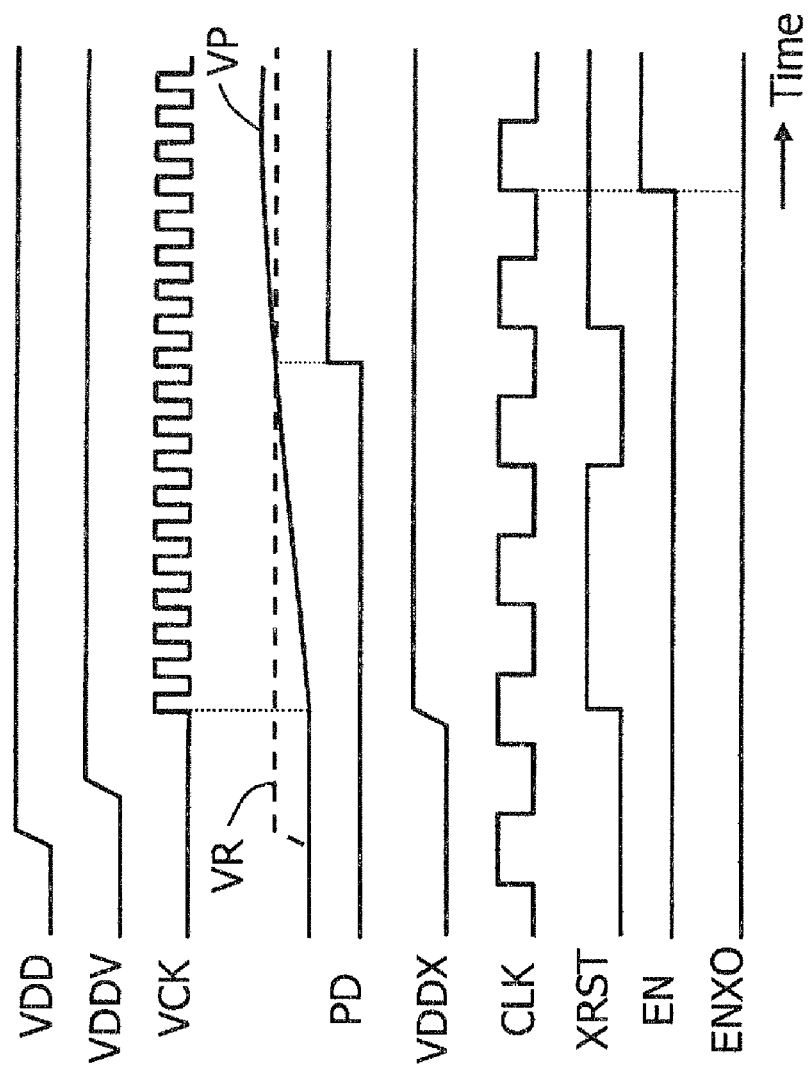
FIG. 16 is a timing diagram illustrating an operation when the oscillator (for example, VCTCXO) 40 is connected as the external component.

FIG. 16 is a timing diagram illustrating an operation when the oscillator (for example, VCTCXO) 40 is connected as the external component. The oscillator 40 outputs the clock VCK when the power voltage VDDV is input. The clock detector circuit 50 operates at the rising edge of the power voltage VDD of the system, and the detection output PD transitions to a high level when the voltage VP is higher than the reference voltage VR. Meanwhile, the starter circuit 30 generates the reset signal XRST and the enable signal EN of the circuit 5 of the oscillation circuit DCXO. Since the enable signal EN has the high level but an inversion of the detection output PD of the clock detector circuit 50 transitions to the low level, the enable signal ENXO of the low level is output from the AND gate 80, and the circuit 5 becomes a power-down state. In this case, the clock output from the circuit 5 is fixed to the low level, and the clock VCK of the VCTCXO 40 is output from the OR gate 81 as the output clock SCK.

Further, when the crystal resonator 4 is externally connected, since the detection output PD of the clock detector circuit 50 has the low level, the enable signal ENXO of the high level is output from the AND gate 80, and so the oscillator DCXO configured with the crystal resonator 4 and the circuit 5 performs an oscillation operation. In this case, since the oscillator 40 is not connected, the clock VCK has the low level, and the clock from the circuit 5 that configures the oscillation circuit DCXO is output as the output clock SCK through the OR gate 81.

According to the first, second and third embodiments, there are the following advantages.

(1) The frequency deviation of the oscillator is not detected by directly measuring an oscillation frequency in an AC manner by an external measuring device or the like, but is detected by measuring a variation in capacitance value deciding an oscillation frequency in a DC manner by a circuit inside an IC. Thus, an extensive measuring environment is not necessary, and the cost is reduced.

(2) Since a variation in capacitance value is measured and detected in a DC manner by a circuit inside an IC, capacitance correction for reducing the variation is performed by self-completion within its own circuit using the comparator, the switch, or the control circuit.

(3) The capacitance is corrected by the calibration operation during the operation preparation time such as when electrical power is turned on, and the result is saved in the register and reflected at the time of the normal operation. Thus, an initial variation of the oscillator is reduced.

(4) Since the external component of the oscillator may be arbitrarily selected and connected, different uses may be made according to a customer's specification by the same circuit, the same chip configuration, the same system, and the same software, and the cost is reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has been described in detail, it should be understood that the various changes, substitutions, and alterations could be made hereto without departing from the spirit and scope of the invention.

The invention claimed is:

1. An oscillation circuit, connected to an external piezoelectric resonator, comprising:
    a first inverter circuit that includes an input terminal and an output terminal which are connected to both terminals of the piezoelectric resonator, respectively;
    a first feedback resistor that is disposed between the input terminal and the output terminal of the first inverter circuit;
    first and second variable capacitive elements that are connected to the input terminal and the output terminal of the first inverter circuit, respectively, and have capacitance values that are variably settable by a control signal;
    a charging circuit that supplies the input terminal or the output terminal with a certain reference current in order to charge the first or second variable capacitive element;
    a comparator that compares a charging voltage of the input terminal or the output terminal with a reference voltage; and
    a control circuit that, in a calibration operation, at a first time, causes the charging circuit to start supply the reference current to the input terminal or the output terminal, and, at a second time after the first time, generates the control signal for setting a capacitance value of the first or second variable capacitive element so that the charging voltage becomes close to the reference voltage according to a comparison result of the comparator.

2. The oscillation circuit according to claim 1, wherein at the time of calibration, the control circuit generates the control signal for increasing the capacitance value of the first or second variable capacitive element when the comparison result of the comparator represents that the charging voltage is higher than the reference voltage and generates the control signal for decreasing the capacitance value of the first or second variable capacitive element when the comparison result of the comparator represents that the charging voltage is lower than the reference voltage.

3. The oscillation circuit according to claim 1, further comprising:
a reference current generating circuit that generates the reference current; and
a reference voltage generating circuit that generates the reference voltage by supplying the reference current to an externally connected reference resistor.

4. The oscillation circuit according to claim 1, wherein at the time of calibration, the control circuit stops an oscillation operation by the first inverter circuit and the piezoelectric resonator.

5. The oscillation circuit according to claim 1, further comprising a reference current generating circuit that generates the reference current, wherein
at the time of calibration, the charging circuit connects the reference current generating circuit to the input terminal or the output terminal at the first time.

6. An oscillation circuit, connected to an external piezoelectric resonator and a first feedback resistor, comprising:
a first inverter circuit that includes an input terminal and an output terminal which are connected to both terminals of the piezoelectric resonator, respectively, the first feedback resistor being connected between the input terminal and the output terminal;
first and second variable capacitive elements that are connected to the input terminal and the output terminal of the first inverter circuit, respectively, and have capacitance values that are variably settable by a control signal, respectively;
a comparator that compares a discharging voltage of the input terminal or the output terminal with a reference voltage; and
a control circuit that, in a calibration operation, applies a first voltage to the input terminal or the output terminal to charge the first or second variable capacitive element, then, at a first time, starts to discharge the first or second variable capacitive element via the first feedback resistor, and, according to a comparison result of the comparator at a second time after the first time, generates the control signal for setting a capacitance value of the first or second variable capacitive element so that a discharging voltage of the input terminal or the output terminal becomes close to the reference voltage.

7. The oscillation circuit according to claim 6, wherein at the time of calibration, the control circuit generates the control signal for decreasing the capacitance value of the first or second variable capacitive element when the comparison result of the comparator represents that the discharging voltage is higher than the reference voltage and generates the control signal for increasing the capacitance value of the first or second variable capacitive element when the comparison result of the comparator represents that the discharging voltage is lower than the reference voltage.

8. The oscillation circuit according to claim 6, further comprising:
a first voltage generating circuit that generates the first voltage by supplying a first resistor with a certain reference current; and
a second voltage generating circuit that generates the reference voltage that is lower than the first voltage by supplying a second resistor with the reference current.

9. The oscillation circuit according to claim 6, wherein at the time of calibration, the control circuit stops an oscillation operation by the first inverter circuit and the piezoelectric resonator.

10. The oscillation circuit according to claim 6, wherein at the time of calibration, the control circuit connects the input terminal or the output terminal to a reference power voltage via the feedback resistor at the first time.

11. An oscillation circuit, connected to an external piezoelectric resonator, comprising:
a first inverter circuit that includes an input terminal and an output terminal which are connected to both terminals of the piezoelectric resonator, respectively;
a first feedback resistor that is disposed between the input terminal and the output terminal of the first inverter circuit;
first and second variable capacitive elements that are connected to the input terminal and the output terminal of the first inverter circuit, respectively, and have capacitance values that are variably settable by a control signal, respectively;
a comparator that compares a monitoring voltage of the input terminal or the output terminal with a reference voltage; and
a control circuit that, in a calibration operation, short-circuits both terminals of the first or second variable capacitive element and both terminals of the piezoelectric resonator in a state in which a first voltage is applied, and then generates the control signal for setting a capacitance value of the first or second variable capacitive element so that the monitoring voltage obtained when the first or second variable capacitive element and the piezoelectric resonator are serially connected becomes close to the reference voltage according to a comparison result by the comparator between the monitoring voltage and the reference voltage.

12. The oscillation circuit according to claim 11, wherein at the time of calibration, the control circuit generates the control signal for increasing the capacitance value of the first or second variable capacitive element when the comparison result of the comparator represents that the monitoring voltage is higher than the reference voltage and generates the control signal for decreasing the capacitance value of the first or second variable capacitive element when the comparison result of the comparator represents that the monitoring voltage is lower than the reference voltage.

13. The oscillation circuit according to claim 11, further comprising:
a reference current generating circuit that generates the reference current;
a first voltage generating circuit that generates the first voltage by supplying a first resistor with a certain reference current; and
a second voltage generating circuit that generates the reference voltage that is lower than the first voltage by supplying a second resistor with the reference current.

14. The oscillation circuit according to claim 11, wherein at the time of calibration, the control circuit stops an oscillation operation by the inverter circuit and the piezoelectric resonator.

15. The oscillation circuit according to claim 1, further comprising:
a second inverter; and
a second feedback resistor that is connected between an input terminal and an output terminal of the second inverter, wherein
at the time of calibration, the control circuit connects the input terminal and the output terminal of the second inverter with the piezoelectric resonator and controls the first and second times based on timing of a clock generated by an oscillator configured by the piezoelectric resonator and the second inverter.

16. The oscillation circuit according to claim 6, further comprising:
a second inverter; and
a second feedback resistor that is connected between an input terminal and an output terminal of the second inverter, wherein
at the time of calibration, the control circuit connects the input terminal and the output terminal of the second inverter with the piezoelectric resonator and controls the first and second times based on timing of a clock generated by an oscillator configured by the piezoelectric resonator and the second inverter.

17. The oscillation circuit according to claim 1, further comprising
a starter circuit that supplies the control circuit with a reset signal after power is turned on and then supplies the control circuit with an enable signal for starting a calibration operation.

18. The oscillation circuit according to claim 6, further comprising
a starter circuit that supplies the control circuit with a reset signal after power is turned on and then supplies the control circuit with an enable signal for starting a calibration operation.

19. The oscillation circuit according to claim 11, further comprising
a starter circuit that supplies the control circuit with a reset signal after power is turned on and then supplies the control circuit with an enable signal for starting a calibration operation.

20. The oscillation circuit according to claim 17, further comprising:
a second oscillation circuit that is externally connectable;
a detector circuit that detects a clock generated by the second oscillation circuit when the second oscillation circuit is connected, wherein
when the detector circuit has detected the clock generated by the second oscillation circuit, supply of the enable signal to the control circuit stops, and the clock generated by the second oscillation circuit is output, and
when the detector circuit has not detected the clock generated by the second oscillation circuit, the enable signal is supplied to the control circuit, and a clock generated by an oscillation circuit configured by the piezoelectric resonator and the first inverter is output.

* * * * *